United States Patent
Hanamaki et al.

(10) Patent No.: US 7,259,406 B2
(45) Date of Patent: Aug. 21, 2007

(54) SEMICONDUCTOR OPTICAL ELEMENT

(75) Inventors: Yoshihiko Hanamaki, Tokyo (JP); Kenichi Ono, Tokyo (JP); Kimio Shigihara, Tokyo (JP); Kazushige Kawasaki, Tokyo (JP); Kimitaka Shibata, Tokyo (JP); Naoyuki Shimada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 164 days.

(21) Appl. No.: 11/263,997

(22) Filed: Nov. 2, 2005

(65) Prior Publication Data

US 2006/0220037 A1 Oct. 5, 2006

(30) Foreign Application Priority Data

Mar. 3, 2005 (JP) ............................. 2005-059595

(51) Int. Cl.
| | |
|---|---|
| H01L 29/24 | (2006.01) |
| H01L 33/00 | (2006.01) |
| H01L 29/06 | (2006.01) |
| H01L 29/12 | (2006.01) |
| H01L 31/0328 | (2006.01) |

(52) U.S. Cl. ............... 257/103; 257/11; 257/12; 257/13; 257/22; 257/37; 257/53; 257/79; 257/86; 257/94; 257/96; 257/97; 257/101; 257/102; 257/183; 257/190; 257/201

(58) Field of Classification Search ............ 257/11–13, 257/22, 37, 53, 79, 86, 94, 96–97, 101–103, 257/183, 190, 201
See application file for complete search history.

(56) References Cited

U.S. PATENT DOCUMENTS 5,255,281 A * 10/1993 Sugano et al. ........... 372/46.01

(Continued)

FOREIGN PATENT DOCUMENTS

JP 11-054828 2/1999

OTHER PUBLICATIONS

Wade, J.K. et al., "6.1W continuous wave front-facet power from al-free active-region (λ=805nm) diode lasers", *Appl. Phys.*, 72(1): pp. 4-6(1998).

(Continued)

*Primary Examiner*—Ida M. Soward
(74) *Attorney, Agent, or Firm*—Leydig, Voit & Myer, Ltd.

(57) ABSTRACT

A semiconductor optical element having a includes an n-type GaAs buffer layer, an n-type AlGaInP cladding layer, a first InGaAsP (including zero As content)guide layer without added dopant impurities, an InGaAsP (including zero In content) active layer, a second InGaAsP (including zero As content)guide layer without added dopant impurities, a p-type AlGaInP cladding layer, a p-type band discontinuity reduction layer, and a p-type GaAs contact layer sequentially laminated on an n-type GaAs substrate C or Mg is the dopant impurity in the p-type GaAs contact layer, the p-type band discontinuity reduction layer, and the p-type AlGaInP cladding layer.

4 Claims, 3 Drawing Sheets

U.S. PATENT DOCUMENTS

| | | | |
|---|---|---|---|
| 5,586,135 A * | 12/1996 | Yoshida et al. | 372/45.01 |
| 6,879,614 B2 * | 4/2005 | Sato | 372/45.01 |
| 2002/0154675 A1 | 10/2002 | Deng et al. | |
| 2003/0132431 A1 | 7/2003 | Hanamaki | |
| 2004/0165626 A1 | 8/2004 | Kuniyasu et al. | |
| 2005/0040409 A1 * | 2/2005 | Takeya et al. | 257/79 |
| 2005/0111506 A1 * | 5/2005 | Ohta et al. | 372/46 |
| 2005/0185687 A1 * | 8/2005 | Ohgoh | 372/43.01 |
| 2005/0201439 A1 * | 9/2005 | Horie | 372/43.01 |
| 2005/0280013 A1 * | 12/2005 | Sun et al. | 257/98 |

OTHER PUBLICATIONS

J. Sebastian et al. "High-Power 810-nm GaAsP-AlGaAS Diode Lasers With Narrow Beam Divergence", IEEE Journal on Selected Topics in Quantum Electronics, vol. 7, No., Mar./Apr. 2001 pp. 334-339.

K. Uppal et al., "Strain effects on InGaP-InGaAsP-GaAsP Tensile Strained Quantum-Well Lasers", IEEE Photonics Technology Letters, vol. 7, No. 10, Oct. 1995 pp. 1128-1130.

* cited by examiner

SEMICONDUCTOR OPTICAL ELEMENT

BACKGROUND OF THE INVENTION

1. Field of the Invention

The present invention relates to a semiconductor optical element that can enhance power and improve operation reliability by using C or Mg as a p-type impurity.

2. Background Art

Heretofore, Zn has been widely used as a p-type dopant for a semiconductor optical element (refer for example to Japanese Patent Laid-Open No. 11-054828 Summary of the Invention). Table 1 shows the impurity to be added, carrier concentration, and film thickness of each layer in a conventional semiconductor optical element. Here, as an example, a laminated structure of a semiconductor optical element used in a light source that uses a GaAsP/InGaP-based material used for exciting a solid laser in an 808-nm band.

TABLE 1

| Layer name | Impurity | Carrier concentration ($10^{18}/cm^3$) | Film thickness (nm) |
| --- | --- | --- | --- |
| p-type GaAs contact layer | Zn | 10.0-30.0 | 100-500 |
| p-type InGaP-BDR layer | Zn | 1.0-3.0 | 20-100 |
| p-type AlGaInp clad layer | Zn | 1.0-2.0 | 500-1500 |
| InGaAsP guide layer | — | — | 500-1500 |
| GaAsP active layer | — | — | 5-12 |
| InGaAsP guide layer | — | — | 500-1500 |
| n-type AlGaInp clad layer | Si | 0.5-1.5 | 500-1500 |
| n-type GaAs buffer layer | Si | 0.5-1.5 | 200-700 |
| n-type GaAs substrate | Si | 0.7-1.0 | — |

In the constitution of Table 1, an n-type GaAs (or AlGaAs) buffer layer to which Si is added as an n-type impurity, an n-type AlGaInP clad layer to which Si is added, a InGaAsP guide layer without adding impurities, a GaAsP active layer without adding impurities, an InGaAsP guide layer without adding impurities, a p-type AlGaInP clad layer to which Zn is added as a p-type impurity, a p-type InGaP-BDR (band discontinuity reduction) layer to which Zn is added, and a p-type GaAs contact layer to which Zn is added are sequentially laminated on an n-type GaAs substrate.

However, Zn used as a p-type impurity is easily diffused by heat treatment during growing or semiconductor-laser fabricating. Therefore, when the overflow of implanted carriers (electrons in this case) is to be suppressed by raising the Zn concentration of the p-type AlGaInP clad layer, the diffusion of Zn into the GaAsP active layer, in which impurities cannot be mixed under normal conditions is occasionally observed.

Particularly in conventional structures, if a high concentration (for example, $10^{19}/cm^3$ or more) of Zn is added to a p-type GaAs contact layer, the p-type GaAs contact layer acts as a supply source of Zn, and the diffusion of Zn into the GaAsP active layer is further accelerated.

If an impurity is mixed in the active layer, since a nonradiative recombination center is formed causing problems, such as the lowering of emission intensity and the movement of the PN-junction (deviation from the design value), a semiconductor optical element that has favorable characteristics cannot be manufactured. FIG. 4 shows the results of a reliability test of a conventional semiconductor optical element having the structure shown in Table 1. Sudden death is observed at about 400 hours after starting the reliability test, and the structure cannot be the to have sufficient reliability.

SUMMARY OF THE INVENTION

The present invention has been devised to solve the above-described problems, and an object of the present invention is to provide a semiconductor optical element that can prevent the mixing of impurities in the active layer, enhance power, and improve the reliability of operations.

According to one aspect of the present invention, a semiconductor optical element has a structure wherein an n-type GaAs buffer layer, an n-type AlGaInP clad layer, a first InGaAsP (including zero As content) guide layer without adding impurities, an InGaAsP (including zero In content) active layer, a second InGaAsP (including zero As content) guide layer without adding impurities, a p-type AlGaInP clad layer, a p-type band discontinuity reduction layer, and a p-type GaAs contact layer are sequentially laminated on an n-type GaAs substrate; wherein C or Mg is used as the p-type impurity for the p-type GaAs contact layer, the p-type band discontinuity reduction layer, and the p-type AlGaInP clad layer.

According to the present invention, the mixing of impurities in the active layer can be prevented, power can be enhanced, and the reliability of operations can be improved.

Other and further objects, features and advantages of the invention will appear more fully from the following description.

DETAILED DESCRIPTION OF THE PREFERRED EMBODIMENTS

First Embodiment

Figure 1:
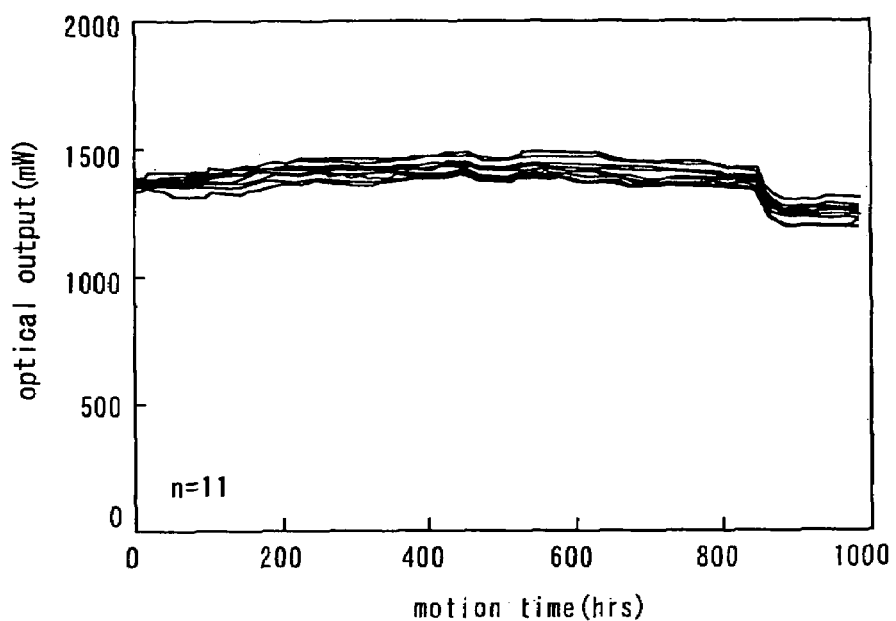
FIG. 1 is a diagram showing the results of a reliability test for a semiconductor optical element according to the First Embodiment of the present invention.
Figure 4:
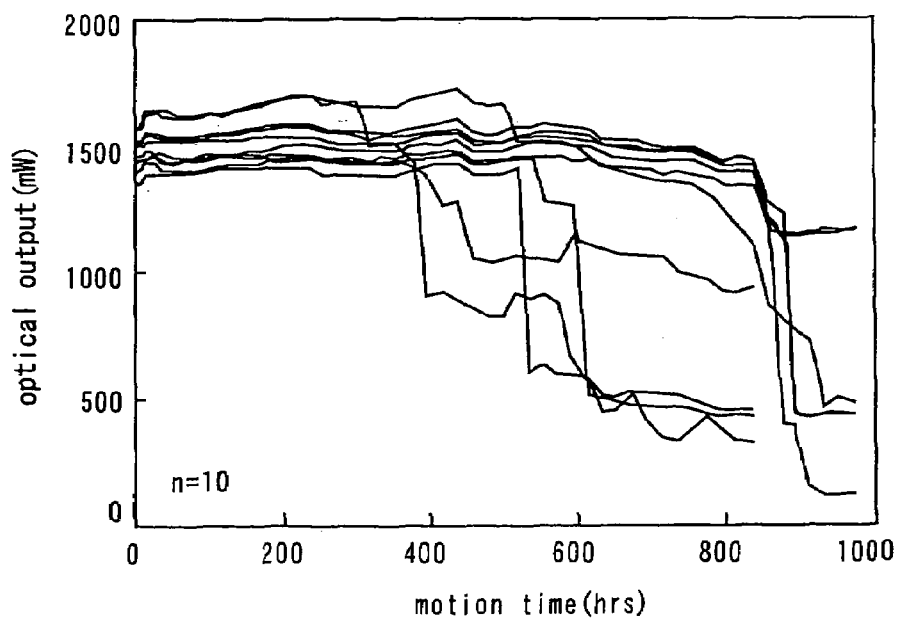
FIG. 4 is a diagram showing the results of a reliability test for a conventional semiconductor optical element.

Table 2 shows the impurity to be added, carrier concentration, and film thickness of each layer in a semiconductor optical element according to the First Embodiment of the present invention. Here, as an example, a laminated structure of a semiconductor optical element used in a power source that uses a GaAsP/InGaP-based material used for exciting a solid laser in an 808-nm band.

TABLE 2

| Layer name | Impurity | Carrier concentration ($10^{18}/cm^3$) | Film thickness (nm) |
| --- | --- | --- | --- |
| p-type GaAs contact layer | C | 30.0-50.0 | 100-500 |
| p-type InGaP-BDR layer | Mg | 1.0-3.0 | 20-100 |

TABLE 2-continued

| Layer name | Impurity | Carrier concentration ($10^{18}$/cm$^3$) | Film thickness (nm) |
| --- | --- | --- | --- |
| p-type AlGaInP clad layer | Mg | 1.0-2.0 | 500-1500 |
| InGaAsP guide layer | — | — | 500-1500 |
| GaAsP active layer | — | — | 5-12 |
| InGaAsP guide layer | — | — | 500-1500 |
| n-type AlGaInP clad layer | Si | 0.5-1.5 | 500-1500 |
| n-type GaAs buffer layer | Si | 0.5-1.5 | 200-700 |
| n-type GaAs substrate | Si | 0.7-1.0 | — |

In the semiconductor optical element of Table 2, an n-type GaAs (or AlGaAs) buffer layer to which Si is added as an n-type impurity, an n-type AlGaInP clad layer to which Si is added, a InGaAsP guide layer without adding impurities, a GaAsP active layer without adding impurities, an InGaAsP guide layer without adding impurities, a p-type AlGaInP clad layer to which Mg is added as a p-type impurity, a p-type InGaP-BDR (band discontinuity reduction) layer to which Mg is added, and a GaAs contact layer to which C is added are sequentially laminated on an n-type GaAs substrate.

As a method for lamination, for example, a crystal growing technique, such as an MOCVD method, is used. In the case of MOCVD growth, the growing temperature is 720° C., the growing pressure is, for example, 100 mbar; and as the raw materials for forming each layer, for example, trimethyl indium (TMI), trimethyl gallium (TMG), trimethyl aluminum (TMA), phosphine (PH$_3$), arsine (AsH$_3$), silane (SiH$_4$), diethyl zinc (DEZn) or the like is used. The flow rates of these material gases are controlled using a mass flow controller or the like to obtain a desired composition.

In the growth of the p-type GaAs contact layer, the growing temperature is, for example, 540° C., and the V/III ratio (flow rate of AsH$_3$ to TMG) is about 1. Normally, the growing temperature for growing a GaAs layer is about 600 to 750° C., and the V/III ratio is several tens to several hundreds. By growing it under the above-described growing conditions, C liberated from methyl groups originally contained in TMG is incorporated without introducing a special material for adding the impurity. Such an intrinsic impurity introducing method can be used, or carbon tetrachloride (CCl$_4$), carbon tetrabromide (CBr$_4$) or the like can also be used.

In the First Embodiment, as described above, the p-type impurity to be added to the p-type GaAs contact layer is C, and the p-type impurity to be added to the p-type InGaP-BDR layer and the p-type AlGaInP clad layer is Mg. Mg and C have smaller diffusion coefficients than Zn. Theoretically, no mutual diffusion occurs between C in the p-type GaAs contact layer and Mg in the p-type AlGaInP clad layer. Therefore, the diffusion of impurities into the active layer, which can be observed when Zn is used, can be suppressed.

From this fact, the C concentration in the p-type GaAs contact layer, and the Mg concentration in the p-type InGaP-BDR layer, and the p-type AlGaInP clad layer in the vicinity of the active layer can be elevated compared with the conventional case using Zn.

According to the First Embodiment, therefore, since the diffusion of p-type impurities into the GaAsP active layer can be suppressed while maintaining the carrier concentration in the p-type GaAs contact layer at $4.0 \times 10^{19}$/cm$^3$, and the hole concentration in the p-type AlGaInP clad layer at $2 \times 10^{18}$/cm$^3$, a high-power high-efficiency semiconductor optical element can be realized while maintaining high reliability.

FIG. 1 shows the results of a reliability test of a semiconductor optical element having the structure shown in Table 2. No sudden death occurred at 1000 hours after starting the reliability test exhibiting sufficient reliability.

When the p-type impurity added to the p-type InGaP-BDR layer and the p-type AlGaInP clad layer is Mg, the film formation temperature of the p-type InGaP-BDR layer and the p-type AlGaInP clad layer can be higher than the case wherein all the p-type impurity is C, and the crystallinity of the p-type InGaP-BDR layer and the p-type AlGaInP clad layer can be elevated; therefore, a high-efficiency semiconductor optical element can be obtained.

Figure 2:
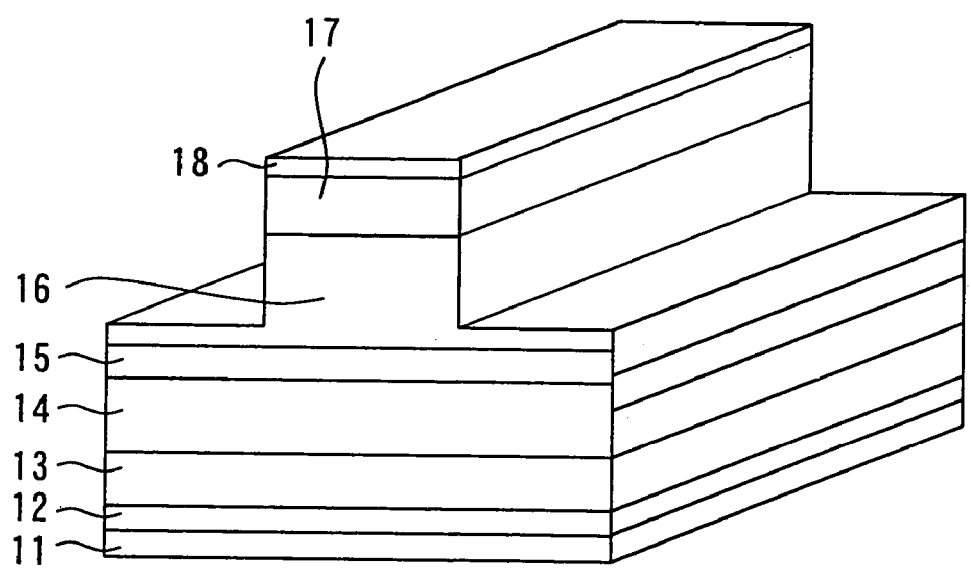
FIG. 2 is a sectional view showing a ridge waveguide type laser to which the semiconductor optical element of the present invention can be applied.
Figure 3:
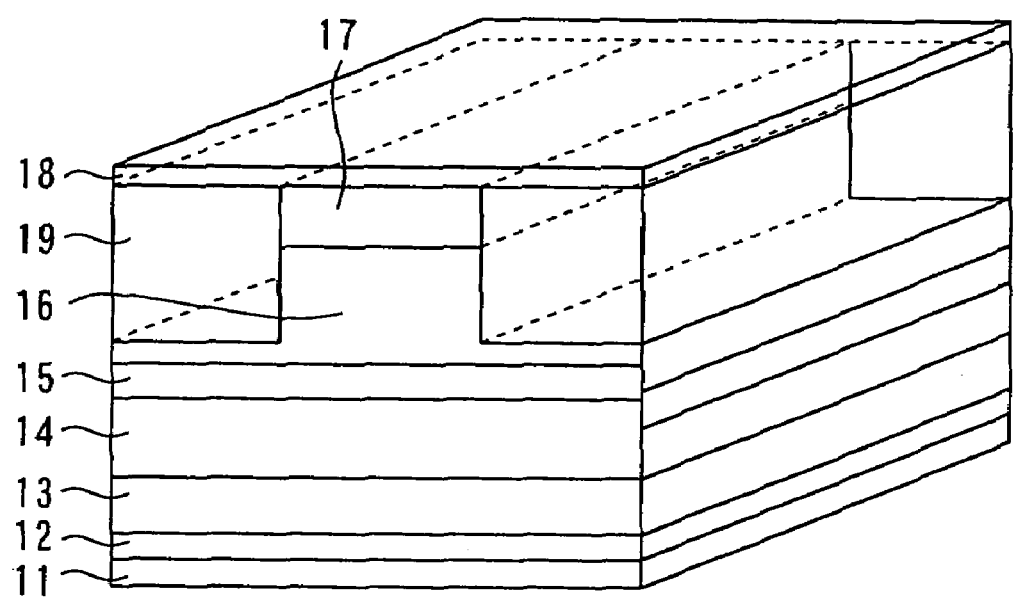
FIG. 3 is a sectional view showing a embedded type laser having a current confinement structure to which the semiconductor optical element of the present invention can be applied.

The above-described semiconductor optical element can be applied to either a ridge waveguide structure laser shown in FIG. 2, or a buried laser having a current confinement structure shown in FIG. 3. In the laser shown in FIG. 2, an n-type electrode 11, an n-type GaAs substrate 12, an n-type GaAs buffer layer 13, an n-type clad layer 14, a GaAsP/InGaP quantum well structure 15, a p-type clad layer 16, a p-type contact layer 17, and a p-type electrode 18 are laminated sequentially from the bottom. In the laser shown in FIG. 3, n-type current block layers 19 are further provided.

In the First Embodiment, although the case using one GaAsP active layer was described, it is not intended to limit the number of active layers, but the same effect can be obtained when tow or more active layers are used. The thickness of each layer shown in Table 2 is not also limited.

Second Embodiment

Table 3 shows the impurity to be added, carrier concentration, and film thickness of each layer in a semiconductor optical element according to the Second Embodiment of the present invention.

TABLE 3

| Layer name | Impurity | Carrier concentration ($10^{18}$/cm$^3$) | Film thickness (nm) |
| --- | --- | --- | --- |
| p-type GaAs contact layer | C | 30.0-50.0 | 100-500 |
| p-type InGaP-BDR layer | C | 1.0-3.0 | 20-100 |
| p-type AlGaInP clad layer | C | 1.0-2.0 | 500-1500 |
| InGaAsP guide layer | — | — | 500-1500 |
| GaAsP active layer | — | — | 5-12 |
| InGaAsP guide layer | — | — | 500-1500 |
| n-type AlGaInP clad layer | Si | 0.5-1.5 | 500-1500 |
| n-type GaAs buffer layer | Si | 0.5-1.5 | 200-700 |
| n-type GaAs substrate | Si | 0.7-1.0 | — |

In the Second Embodiment, the p-type impurity added to the p-type GaAs contact layer, the p-type InGaP-BDR layer, and the p-type AlGaInP clad layer is C. Other constitutions are the same as in the First Embodiment. Thereby, the mixing of impurities in the active layers can be prevented, power can be enhanced, and the reliability of operations can be improved.

Since no p-type dopant materials are required by using C as the p-type impurity to be added to all of the p-type GaAs contact layer, the p-type InGaP-BDR layer, and the p-type AlGaInP clad layer, the fabricating costs can be reduced.

In addition, the fabricating method is substantially the same as in the First Embodiment. However, carbon tetrachloride ($CCl_4$) or carbon tetrabromide ($CBr_4$) must be used for adding C to the AlGaInP layer, and the intrinsic impurity introducing method as described in the First Embodiment cannot be used.

Third Embodiment

Table 4 shows the impurity to be added, carrier concentration, and film thickness of each layer in a semiconductor optical element according to the Third Embodiment of the present invention.

TABLE 4

| Layer name | Impurity | Carrier concentration ($10^{18}/cm^3$) | Film thickness (nm) |
|---|---|---|---|
| p-type GaAs contact layer | Mg | 30.0-50.0 | 100-500 |
| p-type InGaP-BDR layer | Mg | 1.0-3.0 | 20-100 |
| p-type AlGaInP clad layer | Mg | 1.0-2.0 | 500-1500 |
| InGaAsP guide layer | — | — | 500-1500 |
| GaAsP active layer | — | — | 5-12 |
| InGaAsP guide layer | — | — | 500-1500 |
| n-type AlGaInP clad layer | Si | 0.5-1.5 | 500-1500 |
| n-type GaAs buffer layer | Si | 0.5-1.5 | 200-700 |
| n-type GaAs substrate | Si | 0.7-1.0 | — |

In the Third Embodiment, the p-type impurity added to the p-type GaAs contact layer, the p-type InGaP-BDR layer, and the p-type AlGaInP clad layer is Mg. Other constitutions are the same as in the First Embodiment. The fabricating method is the same as the method for adding Mg described in the First Embodiment. Thereby, as in the First Embodiment the mixing of impurities in the active layers can be prevented, power can be enhanced, and the reliability of operations can be improved.

In addition, Since the growing temperature can be set higher than the temperature at which C doping is performed by using Mg as the p-type impurity to be added to all of the p-type GaAs contact layer, the p-type InGaP-BDR layer, and the p-type AlGaInP clad layer, the crystallinity of the semiconductor optical element can be elevated.

Fourth Embodiment

The semiconductor optical element according to the Fourth Embodiment of the present invention is a semiconductor optical element wherein the GaAsP active layer described in Tables 2 to 4 is substituted by an InGaAsP active layer. However, in the InGaAsP composition, the PL light-emitting wavelength of the InGaAsP/InGaP quantum well structure is 790 to 810 nm. Other element structures, the combination of the p-type impurities to be added, and the fabricating methods are the same as in the first to Third Embodiments. Thereby, the effect same as in the first to Third Embodiments can be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-059595, filed on Mar. 3, 2005 including specification, claims, drawings and summary, on which the Convention priority of the present application is based, are incorporated herein by reference in its entirety.

What is claimed is:

1. A semiconductor optical element comprising an n-type GaAs buffer layer, an n-type AlGaInP cladding layer, a first InGaAsP (including zero As content) guide layer without added dopant impurities, an InGaAsP (including zero In content) active layer, a second InGaAsP (including zero As content) guide layer without added dopant impurities, a p-type AlGaInP cladding layer, a p-type band discontinuity reduction layer, and a p-type GaAs contact layer, sequentially laminated, on an n-type GaAs substrate, wherein one of C and Mg is the dopant impurity in the p-type GaAs contact layer, the p-type band discontinuity reduction layer, and the p-type AlGaInP cladding layer.

2. The semiconductor optical element according to claim 1, wherein C is the dopant impurity for the p-type GaAs contact layer, and Mg is the dopant impurity in the p-type band discontinuity reduction layer and the p-type AlGaInP cladding layer.

3. The semiconductor optical element according to claim 1, wherein C is the dopant impurity in the p-type GaAs contact layer, the p-type band discontinuity reduction layer, and the p-type AlGaInP cladding layer.

4. The semiconductor optical element according to claim 1, wherein Mg is the dopant impurity in the p-type GaAs contact layer, the p-type band discontinuity reduction layer, and the p-type AlGaInP cladding layer.

* * * * *